(12) United States Patent
Kirsten

(10) Patent No.: US 7,801,698 B2
(45) Date of Patent: Sep. 21, 2010

(54) SWITCHED LENGTH MATCH TRANSMISSION PATH INSTRUMENT

(75) Inventor: Jeff P. Kirsten, Folsom, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 346 days.

(21) Appl. No.: 12/115,289

(22) Filed: May 5, 2008

(65) Prior Publication Data

US 2009/0201108 A1      Aug. 13, 2009

Related U.S. Application Data

(62) Division of application No. 11/116,822, filed on Apr. 28, 2005, now Pat. No. 7,386,413.

(51) Int. Cl.
*G01M 19/00*     (2006.01)

(52) U.S. Cl. .................. 702/122; 257/728; 333/124; 702/118

(58) Field of Classification Search .............. 702/69, 702/118, 121–124, 190–191; 327/100; 324/76.52, 324/622; 333/124; 375/229; 257/275, 728; 455/11.1, 12.1

See application file for complete search history.

(56) References Cited

U.S. PATENT DOCUMENTS

| 7,053,484 | B2 | 5/2006 | Tayrani |
| 2003/0117231 | A1 * | 6/2003 | Gerlock ..................... 333/124 |

* cited by examiner

*Primary Examiner*—John H Le

(57) ABSTRACT

A testing apparatus includes one or more trace banks. Each trace bank includes (1) an input switch operable to couple an input port to one of multiple output ports, (2) an output switch operable to couple one of multiple input ports to one output port, and (3) transmission lines of different lengths coupled between the output ports of the input switch and the input ports of the output switch. The trace banks can be cascaded using cables to connect their output and input ports. The input and output switches in the trace banks are controlled to provide a transmission path of the desired length.

8 Claims, 5 Drawing Sheets

SWITCHED LENGTH MATCH TRANSMISSION PATH INSTRUMENT

DESCRIPTION OF RELATED ART

Jitter is the deviation of an event from its ideal time. Jitter consists of deterministic jitter and random jitter. Deterministic jitter is the jitter component that is bounded in amplitude. Random jitter is the jitter component that is unbounded in amplitude and follows a Gaussian probability distribution. Deterministic jitter includes data-dependent jitter, which is caused by frequency-dependent losses in transmission links.

It is valuable to generate data-dependent jitter for various transmission path lengths. This helps to accurately simulate a primary source of signal degradation in real applications, provide data as to trace lengths that work across various media distances, and realistically test receiver equalization schemes being used in newer serializer/deserializer (SERDES).

SUMMARY

In one embodiment of the invention, a testing apparatus includes one or more trace banks. Each trace bank includes (1) an input switch operable to couple an input port to one of multiple output ports, (2) an output switch operable to couple one of multiple input ports to one output port, and (3) transmission lines of different lengths coupled between the output ports of the input switch and the input ports of the output switch. The trace banks can be cascaded using cables to connect their output and input ports. The input and output switches in the trace banks are controlled to provide a transmission path of the desired length.

BRIEF DESCRIPTION OF THE DRAWINGS

Use of the same reference numbers in different figures indicates similar or identical elements.

DETAILED DESCRIPTION

There is a need for a testing apparatus that generates various levels of deterministic jitter, or more specifically, to add deterministic jitter to a serial data signal. The intent of the testing apparatus is to generate up to 0.5 UI (unit interval, or bit period) of deterministic jitter at data rates of 1 Gbps (gigabits per second) and to generate deterministic jitter with incremental (step size) control of 0.02 UI at data rates of 10 Gbps.

Figure 1:
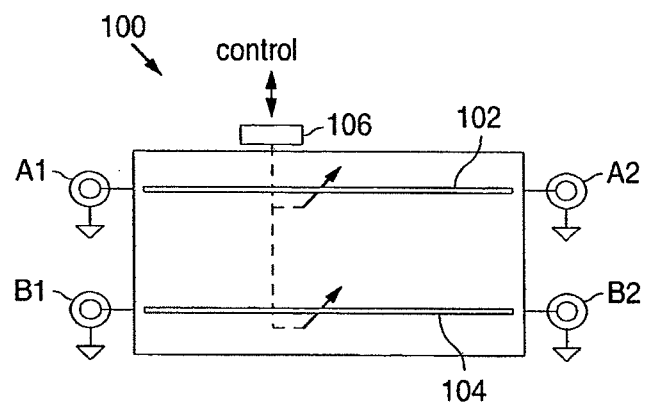
FIG. 1 illustrates a block diagram of a testing apparatus for providing transmission paths of variable lengths in one embodiment of the invention.

FIG. 1 illustrates a testing apparatus 100 in one embodiment of the invention. Apparatus 100 provide a transmission path 102 between ports A1 and A2, and a transmission path 104 between ports B1 and B2. Transmission paths 102 and 104 have variable lengths set through a control interface 106. During testing, a user sets transmission paths 102 and 104 to a desired length, provides differential test signals at ports A1 and B1, and measures the deterministic jitter added to the transmitted signals at ports A2 and B2. In one embodiment, the test signals have a data rate from 1 Gbps to 10 Gbps.

Figure 2:
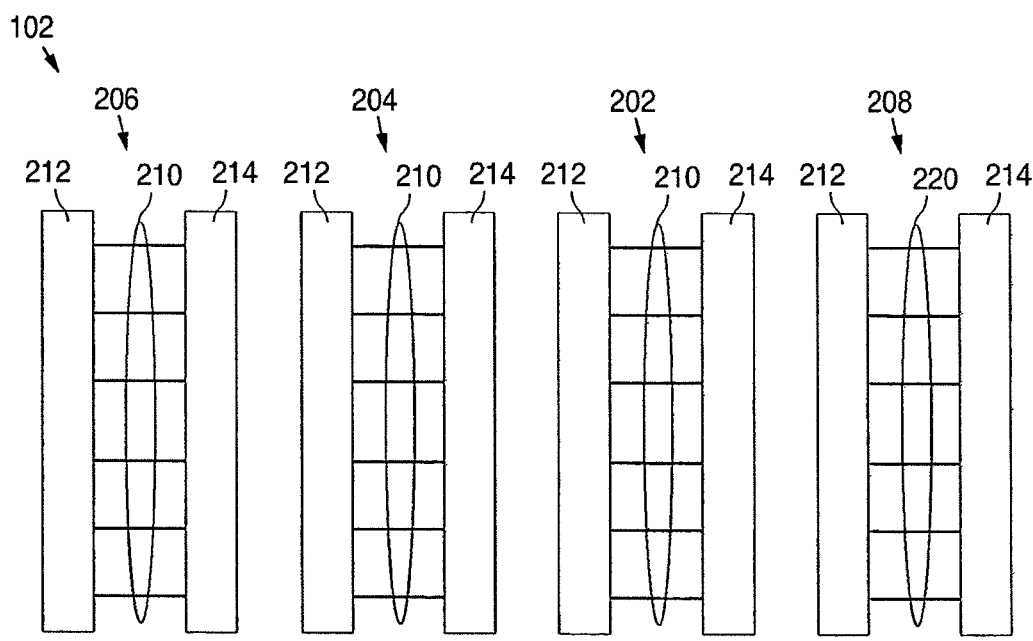
FIG. 2 illustrates a block diagram of trace banks in a transmission path of the apparatus of FIG. 1 in one embodiment of the invention.

FIG. 2 illustrates transmission path 102 in one embodiment of the invention. Although not shown, transmission path 104 is implemented in the same way as transmission 102.

Transmission path 102 includes trace banks 202, 204, and 206, and a de-skew bank 208. Any combination of trace banks 202, 204, and 206 can be cascaded to form a transmission path 102 with the desired length. De-skew bank 208 may be cascaded with trace banks 202, 204, and 206 to correct any length mismatches between transmission paths 102 and 104. Length mismatches between transmission paths 102 and 104 may be caused by variations in the manufacturing process.

In one embodiment, each trace bank includes six traces 210 connected between switches 212 and 214. In each trace bank, switches 212 and 214 select one of traces 210. In one embodiment, traces 210 for trace banks 202, 204, and 206 have the following lengths.

TABLE 1

|  | Trace bank 202 | Trace bank 204 | Trace bank 206 |
| --- | --- | --- | --- |
| Trace 1 | 0.7" | 0.7" | 0.7" |
| Trace 2 | 1.4" | 4.9" | 25.9" |
| Trace 3 | 2.1" | 9.1" | 51.1" |
| Trace 4 | 2.8" | 13.3" | 76.3" |
| Trace 5 | 3.5" | 17.5" | 101.5" |
| Trace 6 | 4.2" | 21.7" | 126.7" |

In one embodiment, de-skew bank 208 includes six traces 220 connected between switches 212 and 214. Switches 212 and 214 select one of traces 220. Traces 220 have a smaller length increment (e.g., 0.07") than traces 210 (e.g., 0.7", 4.2", and 25.2"). In one embodiment, traces 220 for de-skew banks 208 have the following lengths.

TABLE 2

|  | De-skew bank 208 |
| --- | --- |
| Trace 1 | 3.00" |
| Trace 2 | 3.07" |
| Trace 3 | 3.14" |
| Trace 4 | 3.21" |
| Trace 5 | 3.28" |
| Trace 6 | 3.35" |

Figure 3:
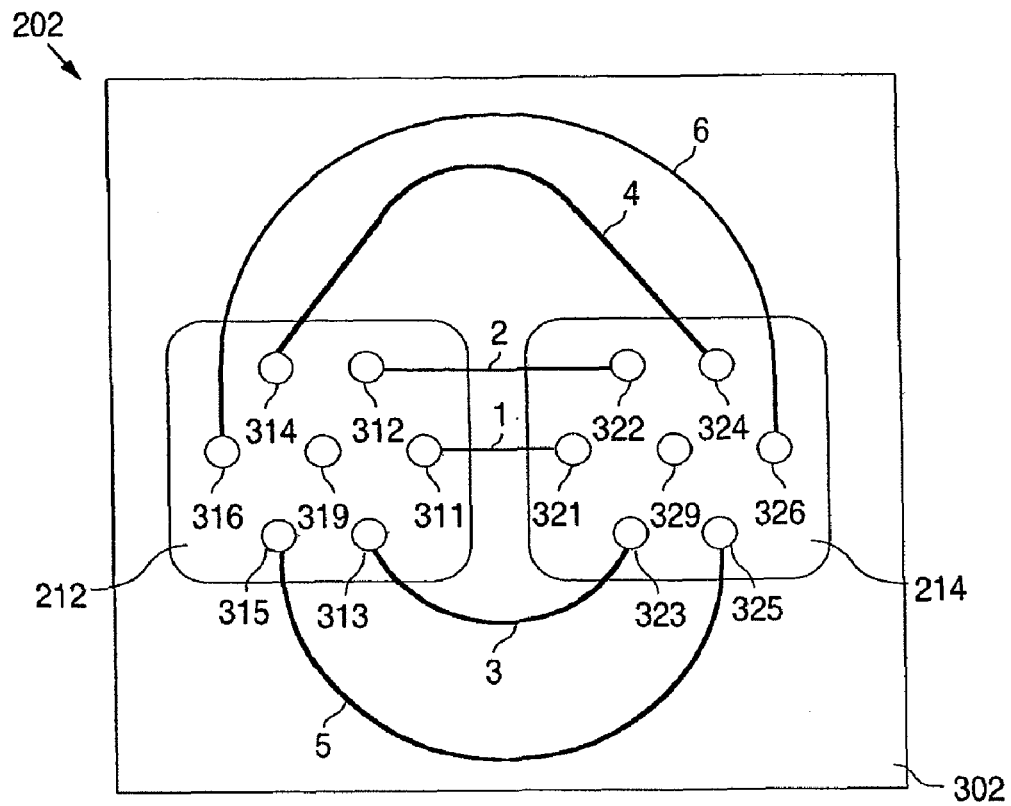
FIGS. 3 and 4 illustrate top and side views of a trace bank of FIG. 2 in one embodiment of the invention.
Figure 4:
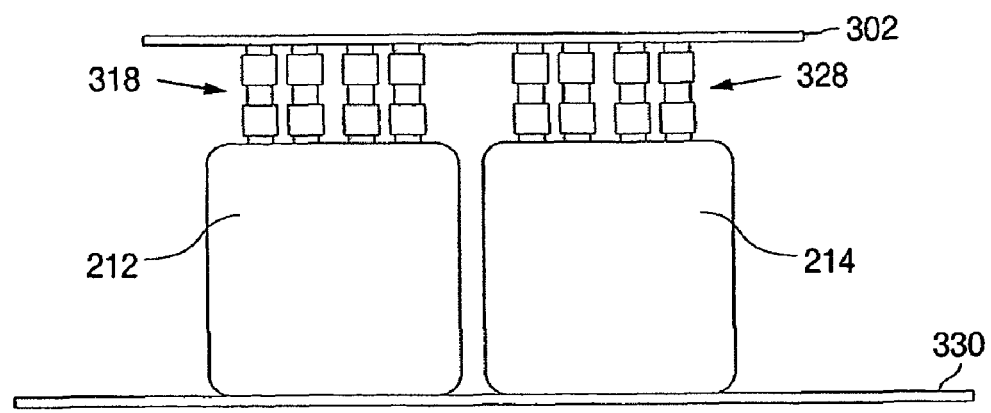

FIGS. 3 and 4 illustrate top and side views of trace bank 202 in one embodiment of the invention. Although not illustrated, banks 204, 206, and 208 are implemented in the same way but for the lengths of the traces between switches 212 and 214.

Traces 1, 2, 3, 4, 5, and 6 are formed on a printed circuit board (PCB) 302. In one embodiment, traces 1 to 6 are 50 ohm, 10 millimeter wide striplines.

Switch 212 has output ports 311, 312, 313, 314, 315, and 316 connected by SMA barrel connectors 318 to respective traces 1 to 6. Switch 212 further has an input port 319 that can be coupled to one of output ports 311 to 316. Switch 214 has input ports 321, 322, 323, 324, 325, and 326 connected by SMA barrel connectors 328 to respective traces 1 to 6. Switch 214 further has an output port 329 that can be coupled to one of input ports 321 to 326. Switches 212 and 214 are mounted to a housing 330 for apparatus 100. In one embodiment, microwave switches 212 and 214 are single-pole, six-throw (SP6T) switches 87106C from Agilent Technologies, Inc. of Palo Alto, Calif.

Input port 319 can be coupled by a cable to (1) a testing equipment to receive test signals (whereby input port 319 becomes input port A1), or (2) an output port 329 of another bank to receive cascaded test signals. Similarly, output port 329 can be coupled by a cable to (1) an input port 319 of another bank or (2) a test equipment to provide cascaded test signals (whereby output port 329 becomes output port A2). With six trace lengths in each bank and three trace banks, a combination of 6 to the power of 3 (216) length steps can be achieved.

Figure 5:
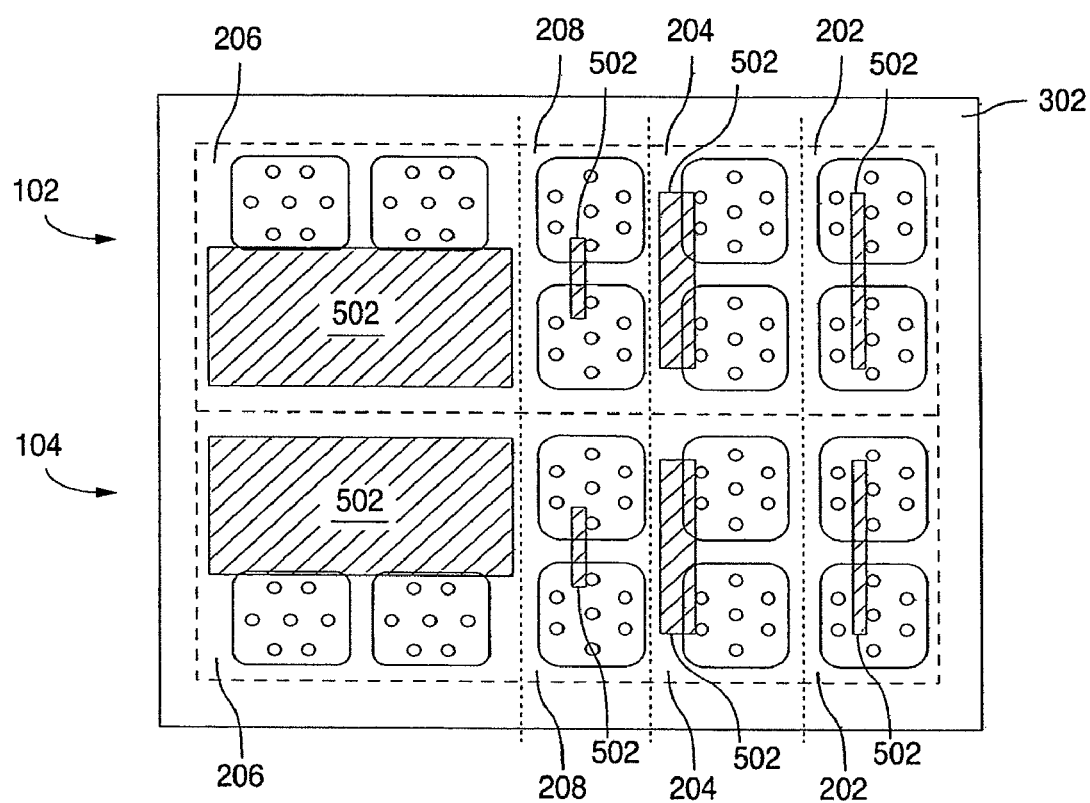
FIG. 5 illustrates a placement of the trace banks and switches of FIG. 2 on a printed circuit board (PCB) in one embodiment of the invention.

FIG. 5 illustrates a placement of banks 202, 204, 206, and 208 for transmission paths 102 and 104 on PCB 302 in one embodiment of the invention. Shaded boxes 502 indicate areas consumed by the traces for each bank. Note that the layout of transmission paths 102 and 104 on PCB 302 are symmetrical in order to better match transmission paths 102 and 104. If PCB 302 has multiple stripline layers, traces 1 to 6 for all the banks are formed on the same layer to better match transmission paths 102 and 104. Furthermore, traces 1 to 6 in corresponding banks in transmission paths 102 and 104 are placed as close as possible to better match transmission paths 102 and 104.

Figure 6:
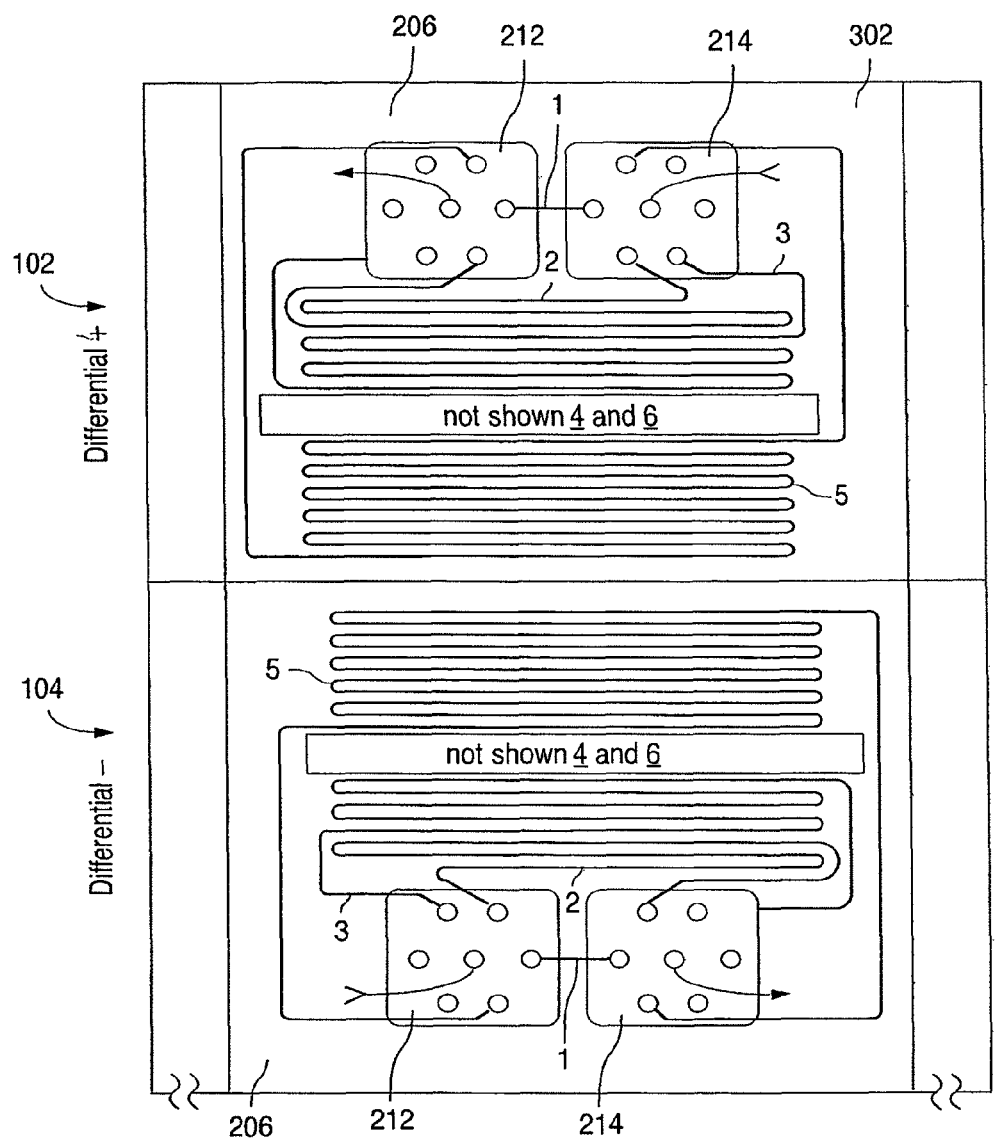
FIG. 6 illustrates a layout of the traces in a trace bank of FIG. 5 on a PCB in one embodiment of the invention.

FIG. 6 illustrates a layout of traces 1 to 6 for banks 206 in transmission paths 102 and 104 in one embodiment of the invention. Due to their lengths, both sets of traces 1 to 6 have serpentine patterns to minimize their footprints. Both sets of serpentine traces 1 to 6 have the same layer orientation (e.g., left to right) for corresponding banks in transmission paths 102 and 104 to better match transmission paths 102 and 104.

Figure 7:
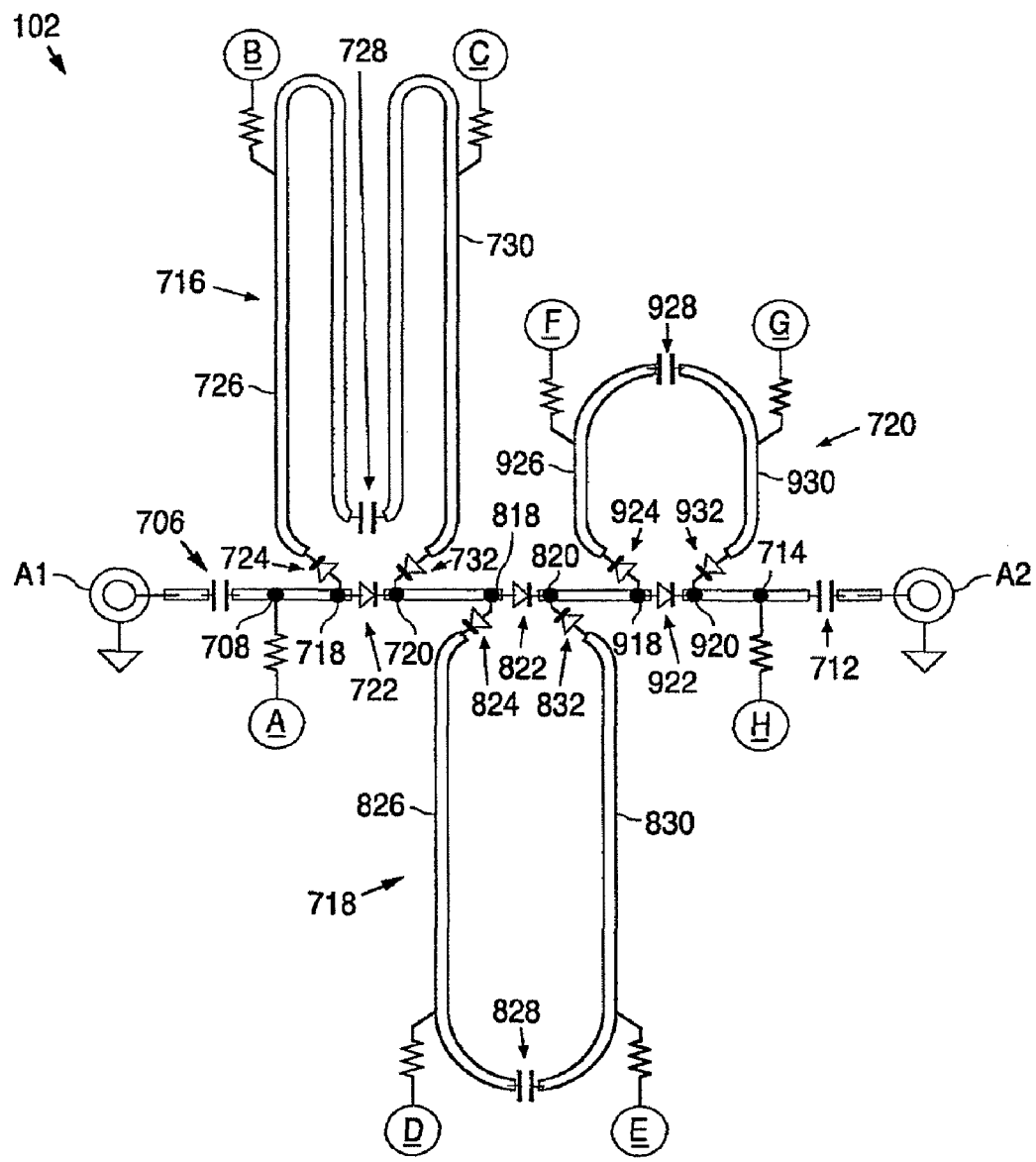
FIG. 7 illustrates another trace bank of FIG. 2 in another embodiment of the invention.

FIG. 7 illustrates a transmission path 102 in another embodiment of the invention. Transmission path 104 is implemented in the same way as transmission path 102.

Input port A1 is coupled by a coupling capacitor 706 to a node 708. A voltage source A with a biasing resistor is connected to node 708. Output port A2 is coupled by a coupling capacitor 712 to a node 714. A voltage source H with a biasing resistor is connected to node 714. Switched links 716, 718, and 720 are connected in series between nodes 708 and 714. In one embodiment, switched links 716, 718, and 720 are binary weighted so that link 716 has a total trace length that is twice of link 718 and four times of link 720. Although only three binary weighted switched links are shown, any number of binary weighted switched links can be added to get 2 to the n power of length steps, where n is the total number of switched links.

Link 716 has an input terminal 718 and an output terminal 720. Input terminal 718 is connected to node 708. Output terminal 720 is coupled to an input terminal 818 of link 718.

A series path diode 722 has its anode connected to input terminal 718 and its cathode connected to output terminal 720. A link diode 724 has its anode coupled to input terminal 718 and its cathode connected to a trace 726. A voltage source B with a biasing resistor is connected to trace 726. A coupling capacitor 728 couples trace 726 to a trace 730. A voltage source C with a biasing resistor is connected to trace 730. A second link diode 732 has its anode connected to trace 730 and its cathode connected to output terminal 720. In one embodiment, all the diodes are PIN (positive-intrinsic-negative) diodes.

Links 718 and 720 are implemented in the same way as link 716. Corresponding parts in link 718 have been given the same reference number in the 800's while corresponding parts in link 720 have been given the same reference number in the 900's.

In link 718, a voltage source D with a biasing resistor is connected to trace 826 and a voltage source E with a biasing resistor is connected to trace 830. Input terminal 818 is connected to output terminal 720 of link 716. Output terminal 820 is connected to input terminal 918 of link 720.

In link 720, a voltage source F is connected to trace 926 and a voltage G is connected to trace 930. Output terminal 920 is connected to node 714.

In a link, the diodes act as switches. To bypass the link, the series path diode is turned on and the link diodes are turned off. To add the link to the transmission path between ports 704 and 710, the series path diode is turned off and the link diodes are turned on. The series path diodes and the link diodes are turned on and off by applying the appropriate DC (direct current) biasing voltages with voltage sources A to H. In one embodiment, the resistance of all the biasing resistors is 1 kilo Ohms, the capacitance of all blocking capacitors is 0.01 microfarad, and the applied voltages and the resulting length are as follows:

TABLE 3

| Total length | Links switched in | A | B | C | D | E | F | G | H |
|---|---|---|---|---|---|---|---|---|---|
| 0 | None | +10 V | +50 V | −50 V | +50 V | −50 V | +50 V | −50 V | −10 V |
| 1x | 720 | +10 V | +50 V | −50 V | +50 V | −50 V | −10 V | +60 V | +40 V |
| 2x | 718 | +10 V | +50 V | −50 V | −10 V | +60 V | +100 V | 0 V | +40 V |
| 3x | 718, 720 | +10 V | +50 V | −50 V | −10 V | +60 V | +40 V | +110 V | +90 V |
| 4x | 716 | +10 V | −10 V | +60 V | +100 V | 0 V | +100 V | 0 V | +40 V |
| 5x | 716, 720 | +10 V | −10 V | +60 V | +100 V | 0 V | +40 V | +110 V | +90 V |
| 6x | 716, 718 | +10 V | −10 V | +60 V | +40 V | +110 V | +150 V | +50 V | +90 V |
| 7x | 716, 718, 720 | +10 V | −10 V | +60 V | +40 V | +110 V | +90 V | +160 V | +140 V |

Assuming ideal diodes are used (zero forward voltage drop, zero reverse leakage current), the voltages in Table 3 provide up to 10 milliamps of forward current for all "on" diodes and 50 volts of reverse bias voltage for all "off" diodes. Note that more coupling capacitors and biasing resistors could be used to isolate each switched link and make the biasing voltage scheme more straightforward. However, the minimum number of coupling capacitors and biasing resistors are used to provide the "cleanest" possible transmission paths with a more complex biasing voltage scheme.

Various other adaptations and combinations of features of the embodiments disclosed are within the scope of the invention. Numerous embodiments are encompassed by the following claims.

What is claimed is:

1. A testing apparatus, comprising:
   an input port;
   a first node;
   a first coupling capacitor coupled between the input port and the first node;
   a first voltage source coupled to the first node;
   a second node;
   an output port;
   a second coupling capacitor coupled between the second node and the output port;
   a second voltage source coupled to the second node;
   a plurality of switched links of different lengths coupled in series between the first node and the second node, each of the plurality of switched links comprising:
      an input terminal;
      an output terminal;
      a first transmission line having a first end and a second end;
      a second transmission line having a third end and a fourth end;
      a first diode having (1) a first anode coupled to the input terminal and (2) a first cathode coupled to the output terminal;
      a second diode having (1) a second anode coupled to the input terminal and (2) a second cathode coupled to a first end of the first transmission line;
      a third coupling capacitor coupling the second end of the first transmission line and the third end of the second transmission line;
      a third diode having (1) a third anode coupled to the fourth end of the second transmission line and (2) a third cathode coupled to the output terminal;
      a third voltage source coupled to the first transmission line;
      a fourth voltage source coupled to the second transmission line.

2. The apparatus of claim 1, wherein the switched links have different lengths.

3. The apparatus of claim 1, wherein the transmission lines comprise striplines.

4. The apparatus of claim 1, wherein the first, the second, and the third diodes are PIN (positive-intrinsic-negative) diodes.

5. The apparatus of claim 1, further comprising a de-skew bank, the de-skew bank having transmission lines, each of the transmission lines having a length that is different from each of the other transmission lines in the de-skew bank.

6. The apparatus of claim 5, wherein at least one switched link is inserted in a circuit supporting a serial data signal to generate a modified data signal with deterministic jitter of up to half a bit period at a desired data rate.

7. The apparatus of claim 5, wherein at least one switched link is inserted in a circuit supporting a serial data signal to generate a modified data signal with incremental control of deterministic jitter.

8. The apparatus of claim 5, wherein at least one switched link is inserted in a circuit supporting a serial data signal to generate a controlled data signal with incremental deterministic jitter.

* * * * *